(12) United States Patent
de Dood et al.

(10) Patent No.: US 7,594,203 B2
(45) Date of Patent: Sep. 22, 2009

(54) PARALLEL OPTIMIZATION USING INDEPENDENT CELL INSTANCES

(75) Inventors: Paul de Dood, Pleasanton, CA (US); Brian Lee, Santa Clara, CA (US); Daniel Albers, Beaver, PA (US)

(73) Assignee: Prolific, Inc., Newark, CA (US)

( * ) Notice: Subject to any disclaimer, the term of this patent is extended or adjusted under 35 U.S.C. 154(b) by 123 days.

(21) Appl. No.: 11/657,367

(22) Filed: Jan. 24, 2007

(65) Prior Publication Data

US 2008/0178128 A1 Jul. 24, 2008

(51) Int. Cl.
*G06F 17/50* (2006.01)
(52) U.S. Cl. .......................................................... 716/2
(58) Field of Classification Search ...................... 716/1, 716/2, 18
See application file for complete search history.

(56) References Cited

U.S. PATENT DOCUMENTS

| | | | |
|---|---|---|---|
| 6,546,532 B1 * | 4/2003 | Kerzman et al. | 716/8 |
| 6,735,742 B2 * | 5/2004 | Hatsch et al. | 716/2 |
| 6,990,651 B2 * | 1/2006 | Balasubramanian et al. | 716/18 |
| 2003/0009734 A1 * | 1/2003 | Burks et al. | 716/6 |

* cited by examiner

*Primary Examiner*—Jack Chiang
*Assistant Examiner*—Binh C Tat
(74) *Attorney, Agent, or Firm*—O'Melveny & Myers LLP; Mark E. Miller

(57) ABSTRACT

The present invention provides a method for parallel optimization of an integrated circuit design based on the use of sets of cell instances that are independent from each other. Multiple changes to a design are analyzed in parallel by ensuring that no two cell instances that are being changed are in the same fan-in and fan-out cones. This property allows full timing analysis to be performed on a design such that multiple alternatives are explored in parallel and accurate results are obtained. By ordering the choice of cell instances to change and by ordering the alternatives to try, a greater degree of optimization is found earlier in the process.

21 Claims, 6 Drawing Sheets

PARALLEL OPTIMIZATION USING INDEPENDENT CELL INSTANCES

FIELD OF THE INVENTION

This invention relates to the field of computer aided design, and more particularly to the optimization of an integrated circuit design to achieve an improved design while maintaining timing closure.

BACKGROUND

Integrated circuits may be designed and optimized across a wide variety of different tradeoffs and optimized across a number of different parameters. Frequently a design has a target timing requirement necessary to achieve a target performance. In a typical synchronous design, the timing requirement represents a target clock rate and meeting the timing requirement means that the device will operate when the clock signal is operated at the target frequency.

Designs sometimes go through an optimization process in an attempt to adjust the size and placement of cells to reduce the worst negative slack (i.e. to reduce the difference between the timing requirement and the slowest path). An example of chip optimization to achieve timing closure is described in U.S. Pat. No. 7,107,551, incorporated herein by reference. Once a chip design has been optimized to the point that it meets the target timing requirement, it is often desirable to optimize other criteria, such as power consumption, so long as the timing requirement continues to be met.

Unfortunately, the amount of computational resources necessary to compute the timing of a design after a change has been made is large, even when employing incremental timing analysis. Consequently, some existing optimization techniques do not perform detailed timing analysis and instead use less accurate but faster techniques to analyze timing when performing optimizations after timing requirements are met. Because of the reduced accuracy, these optimization techniques are necessarily more conservative and are thus not able to take advantages of some optimizations. Alternatively, techniques that utilize a complete timing analysis of each change utilize a large amount of computation resources and are thus not able to explore a large number of possible optimization in a reasonable amount of time for complex designs.

Thus, there is a need for more efficient optimization mechanisms that can explore a greater number of optimizations with fewer computation resources and can do them in the context of full detailed timing analysis.

BRIEF SUMMARY OF THE INVENTION

The present invention provides a method for parallel optimization of an integrated circuit design based on the use of sets of cell instances that are independent from each other. Multiple changes to a design are analyzed in parallel by ensuring that no two cell instances that are being changed are in the same fan-in and fan-out cones. This property allows a detailed timing analysis to be performed on a design such that multiple alternatives are explored in parallel and accurate results are obtained. By ordering the choice of cell instances to change and by ordering the alternatives to try, a greater degree of optimization is found earlier in the process.

DETAILED DESCRIPTION

Figure 1:
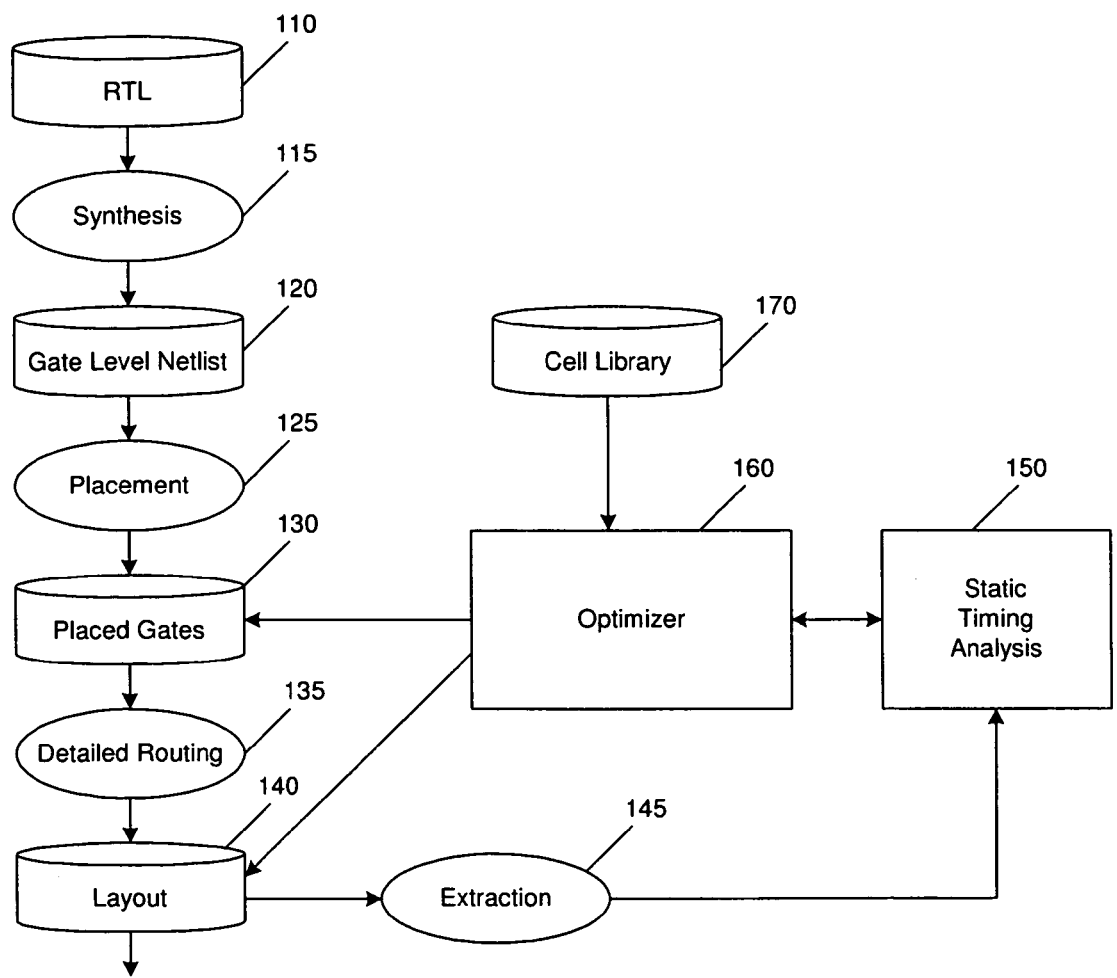
FIG. 1 illustrates a design flow in an embodiment of the invention.

FIG. 1 illustrates an exemplary design flow in an embodiment of the invention. The design of an integrated circuit or a block within an integrated circuit is specified in Register Transfer Language (RTL) description 110. RTL description 110 describes the sequential and combinatorial logic that implement the desired circuit. Through the process of Synthesis 115, RTL description 110 is translated into a Gate Level Netlist 120. Gate Level Netlist 120 is a description of individual gates and how they are interconnected. The process of Placement 125 uses information from Cell Library 170 and establishes physical location for each gate in Gate Level Netlist 120 and generates a collection of Placed Gates 130. Placed Gates 130 contains the physical locations for specific gates from Cell Library 170. During Detailed Routing 135, each of the gates in Placed Gates 130 is connected as appropriate to form Layout 140.

Layout 140 may be sent to a fabrication facility to create an integrated circuit. To establish the performance of the circuit described by Layout 140, timing analysis is typically performed, first by the process of Extraction 145, which establishes electrical characteristics of Layout 140, followed by Static Timing Analysis 150. As a result of Static Timing Analysis 150, an accurate prediction of the performance of the circuit can be determined. Static Timing Analysis 150 in some embodiments can be statistical timing analysis, in which the timing results are based on a certain likelihood of being accurate. Other forms of static timing analysis are possible within the scope of the invention including traditional, statistical or dynamic timing analysis, or any combination of these or other techniques.

Steps 115, 125 and 135 may be iterative individually, and there may also be iteration globally across these steps. In some cases circuit timing is estimated early in the design flow before placement or detailed routing. Subsequently, after detailed routing, and extraction, a more accurate timing analysis can be performed. At this point it is possible to predict the performance of the circuit with a high degree of confidence.

In the case the Static Timing Analysis 150 indicates that the circuit meets desired timing targets, it may be desired to further optimize the circuit while maintaining those timing targets. Optimizer 160 analyzes the circuit and can make replacements of cell instances to optimize Layout 140. In one embodiment, power consumption can be optimized by replacing cell instances with lower power cells that are functionally equivalent. By performing a static timing analysis on each replacement, it can be guaranteed that Optimizer 160 does not cause the circuit to fail to meet its timing targets. In certain embodiments, Optimizer 160 replaces cell instances with other cells instances such that a subsequent Detailed Routing step 135 is necessary to adjust the layout. In other embodiments, Optimizer 160 only replaces cell instances with cells that have exactly the same size and pin locations as the original cells. In this case, Detailed Routing step 135 need not be repeated and the Layout 140 need only be changed to specify different cell instances.

As described in more detail below, Optimizer 160 makes efficient use of Static Timing Analysis 150 by analyzing multiple replacements in parallel. By choosing cell instances as candidates for replacement that are independent from one another, it will be the case that a replacement does not affect another replacement. This means that a single call to Static Timing Analyzer 150 will provide results for multiple potential replacements, greatly speeding up the process of optimization without sacrificing accuracy in the timing analysis.

Figure 2:
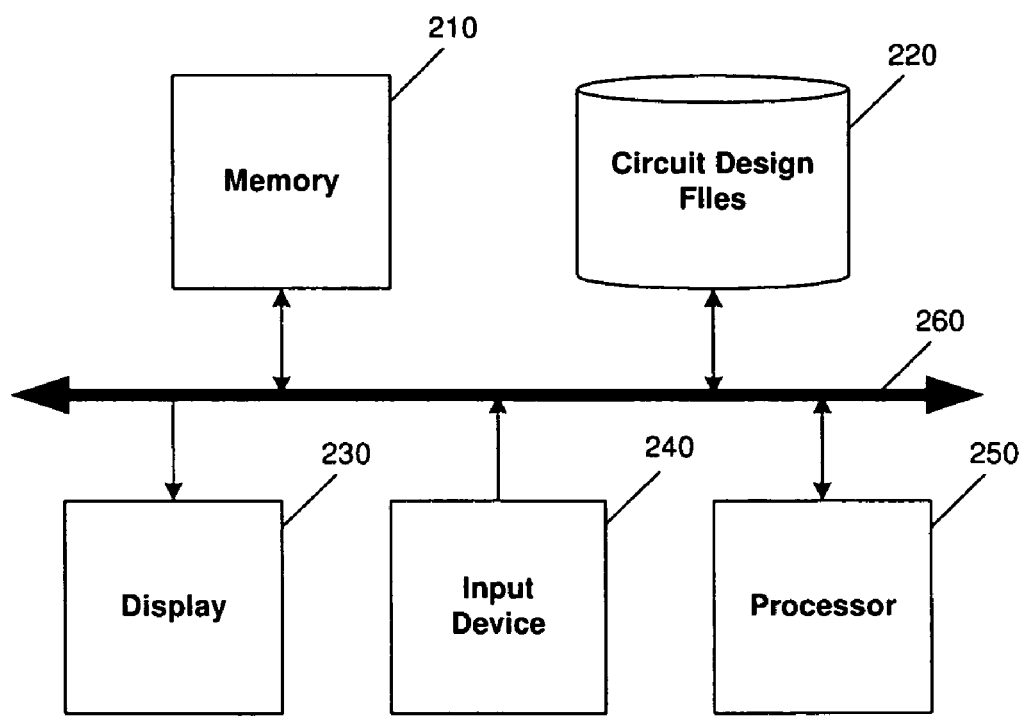
FIG. 2 illustrates an apparatus for practicing the invention.

FIG. 2 illustrates an embodiment of a digital computer system that can be programmed to perform the method of the present invention. Circuit Design Files, such as those described in connection with FIG. 1, are stored on storage device 220. Processor 250 executes instructions to analyze and optimize Circuit Design Files 220, using Memory 210 and bus 260. Input Device 240 and Display 230 may be used in connection with the operation, monitoring and/or control of the optimization process. Other digital computer system configurations can also be employed to perform the steps cited herein. Computer programs implementing the method of the present invention in some embodiments can be distributed on a distribution medium, such as a floppy disk, CD-ROM, DVD or flash memory device. They can then be copied from such a distribution medium to storage device 220 and subsequently loaded into Memory 210. Such programs can also be transmitted electronically over a communications medium, such as a wide area network, and stored on storage device 220 and subsequently loaded into Memory 210. The term "computer-readable medium" encompasses distribution media, storage media, memory and any other medium or device capable of storing a computer program.

Figure 3:
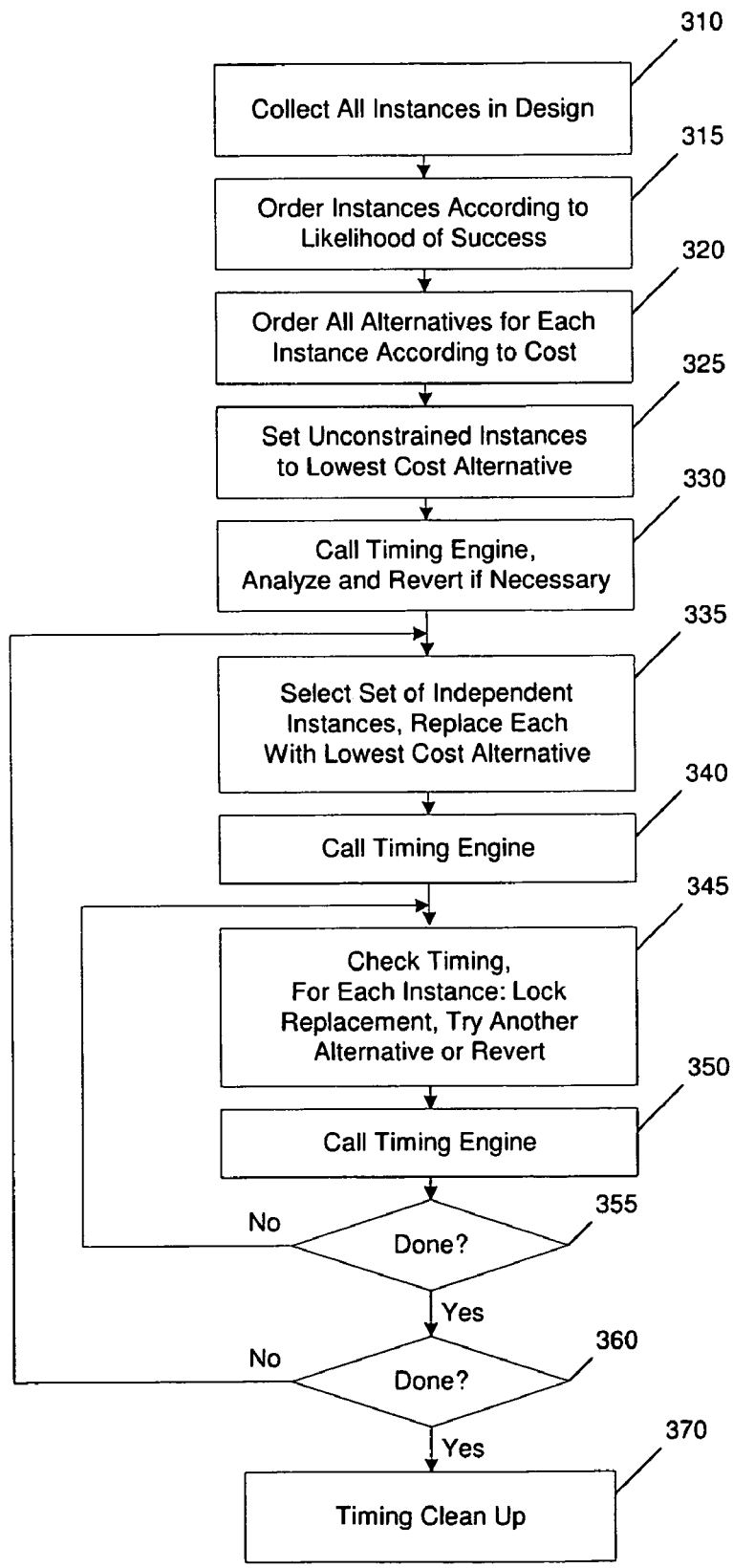
FIG. 3 illustrates a flow chart for an embodiment of the invention.

FIG. 3 illustrates a flow chart illustrating steps in one embodiment of the present invention. In step 310, a design is analyzed and instances are collected that are candidates for replacement. Of all the cell instances in a design, certain instances may be skipped and not made available for replacement. A number of different criteria can be employed to exclude certain instances from optimization. For example, in some embodiments, a cell instance is skipped in certain modes of operation if it is on the clock-tree, or if it is on a critical path or a path close to being critical. A cell instances is also skipped there are no alternative instances in the library.

In step 315, the instances that have been selected as candidates for replacement are ordered according to an optimization criterion. In one embodiment, step 315 orders the instances according to the likelihood of success, i.e. the likelihood that a better alternative will be found. An example of how such a criterion could be computed is to find the instances that have the highest timing slack, the lowest transition time and have the highest cost. Such a criterion suggests a high chance that a lower cost cell could be found without violating the timing requirements of the design. In one embodiment "highest cost" in this context means highest leakage power, although in other embodiments the cost could be dynamic power, yield, area or any combination of these parameters according to a weighted cost function.

In step 320, a list of alternative cells is created for each instance that is a candidate for replacement. Alternative cells are cells functionally equivalent to the cell to be replaced. In some embodiments, the alternative cells may include all functionally equivalent cells in the cell library. In other embodiments, the alternative cells for an instance includes cells that are functionally equivalent and have the same drive strength, with the only difference being the threshold voltage ($V_T$). For example, the cell library may include a low $V_T$ cell and a high $V_T$ cell that are identical in size, pin locations and all routing layers. Such cells may differ only in a diffusion implant that determines the $V_T$ level, and therefore replacing one such cell with the other does not require any changes to placement or routing.

Note that in this example there may be only a single possible alternative for a given instance that is a candidate for replacement. It is also possible that three or more cells are provided that differ only in $V_T$ level (i.e. low, medium and high $V_T$). Step 315 orders all alternative cells, if there is more than one, according to cost. In one embodiment "cost" in this context means leakage power, although in other embodiments the cost could be dynamic power, yield, area or any combination of these parameters according to a weighted cost function.

In certain cases, a design may contain cells that are not constrained by timing. In Step 325, these unconstrained instances are replaced with the lowest cost alternative. In some embodiments, step 325 is skipped and unconstrained instances are not allowed to change. In step 330, a timing analysis is performed with all unconstrained instances replaced with the lowest cost alternatives. Even though unconstrained instances are not on timing paths, there may be other reasons that a replacement may fail timing and thus may have to be reverted to the original cell. For example, instances may have a maximum allowed transition time and a maximum allowed capacitance requirement. Also, often the unconstrained instances are sized greater than minimum for a specific reason, such as they could have timing constraints when run in a different mode (e.g. test or debug), or they could be spare gates (in case an ECO is needed later). In these cases, it may be desirable to treat some or all unconstrained instances as "don't touch" and to skip them altogether.

Steps 335, 340, 345, 350, 355 and 360 represent the outer loop of the optimization process. In step 335, a set of instances is selected such that they are independent from each other. In this context instances are not considered independent if one is in the fan-in or fan-out cone of the other. In step 335 for each instance that is selected for replacement, the lowest cost alternative is chosen. More detail on step 335 is illustrated below in connection with FIG. 4. In step 340, the timing engine is called to update the timing with all changes made in step 335. This is an important feature because it enables a large number of changes to be processed (i.e. timing reevaluated) simultaneously.

Steps 345, 350 and 355 represent an inner loop in which the independent instances selected in step 335 are optimized. In step 345, the timing results are analyzed and replaced instances are either locked (when the timing is acceptable), another alternative is chosen (when the timing is not acceptable and more alternatives exist), or reverted to the original cell (when the timing is not acceptable and there are no more alternatives). More detail on step 345 is illustrated below in connection with FIG. 5.

In step 350, the timing engine is called again to evaluate the updated set of alternatives for the selected instances. In step 355 a termination condition for the inner loop is evaluated and the loop is terminated when the resulting condition is true. The inner loop terminates when an alternative has been found for each selected instance, or when an instance has been reverted to its original cell. Note that when step 355 transitions to step 360, the timing of the design is guaranteed to be within the design targets, since instances will only be replaced with alternatives if the timing is acceptable through the alternative cell.

In step 360, a termination condition for the outer loop is evaluated and the outer loop is terminated when the condition is true. In one embodiment, the outer loop terminates when all instances collected in step 310 have been either replaced or reverted to their original cells. In some embodiments the outer loop terminates when the number of instances selected in step 355 falls below a threshold (for example 0.2 percent of the total instances collected) for three times. In other embodiments the outer loop is limited to a fixed number of iterations and will terminate after that number of iterations have been reached. This can be advantageous since the largest gains are generally achieved in the earlier iterations. In some embodiments, when the number of changes falls below a threshold (for example 0.2 percent of the total instances collected), the changes are grouped together with other changes rather than run separately.

In step 370, timing clean up takes place. If there are any timing errors introduced (which is theoretically possible, but rarely occurs), then call a timing optimizer, such as is described in U.S. Pat. No. 7,107,551, to optimize the timing until the original timing is restored.

Figure 4:
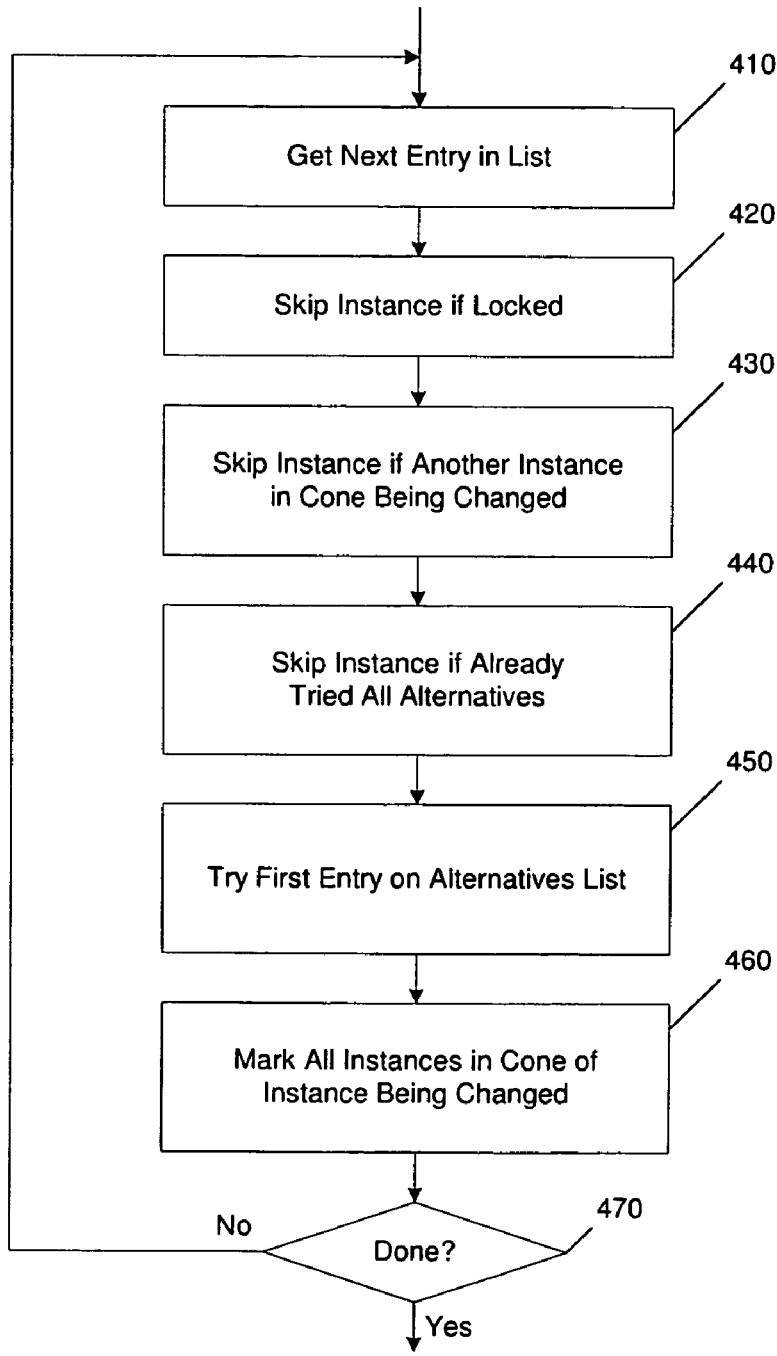
FIG. 4 illustrates a flow chart for an embodiment of the invention.

FIG. 4 illustrates more detail of step 335 in one embodiment. Steps 410, 420, 430, 440, 450, 460 and 470 represent a loop in which a set of independent cells are selected for replacement. This loop processes the set of instances collected in step 310 in the order established in step 315. In step 410, the next instance on the collected list is identified. In step 420, the identified instance will be skipped when it is locked (i.e. it has already been analyzed and an alternative has been chosen). In step 430, the identified instance is skipped when it has been marked as being dependent on another instance that has already been selected for replacement in this iteration of the outer loop.

In step 440, the instance is skipped if all alternatives have already been tried. In step 450, the identified instance is replaced with the first alternative on the alternatives list for that instance. In step 460, all instances that are in the fan-in or fan-out cone of the identified instance are marked so they will not be selected for replacement in this iteration of the outer loop. In step 470 a termination condition is evaluated. The loop in FIG. 4 terminates when all instances that have been collected have been examined. Thus, step 335 selects the largest set of independent instances for replacement that have not been already been analyzed.

Figure 5:
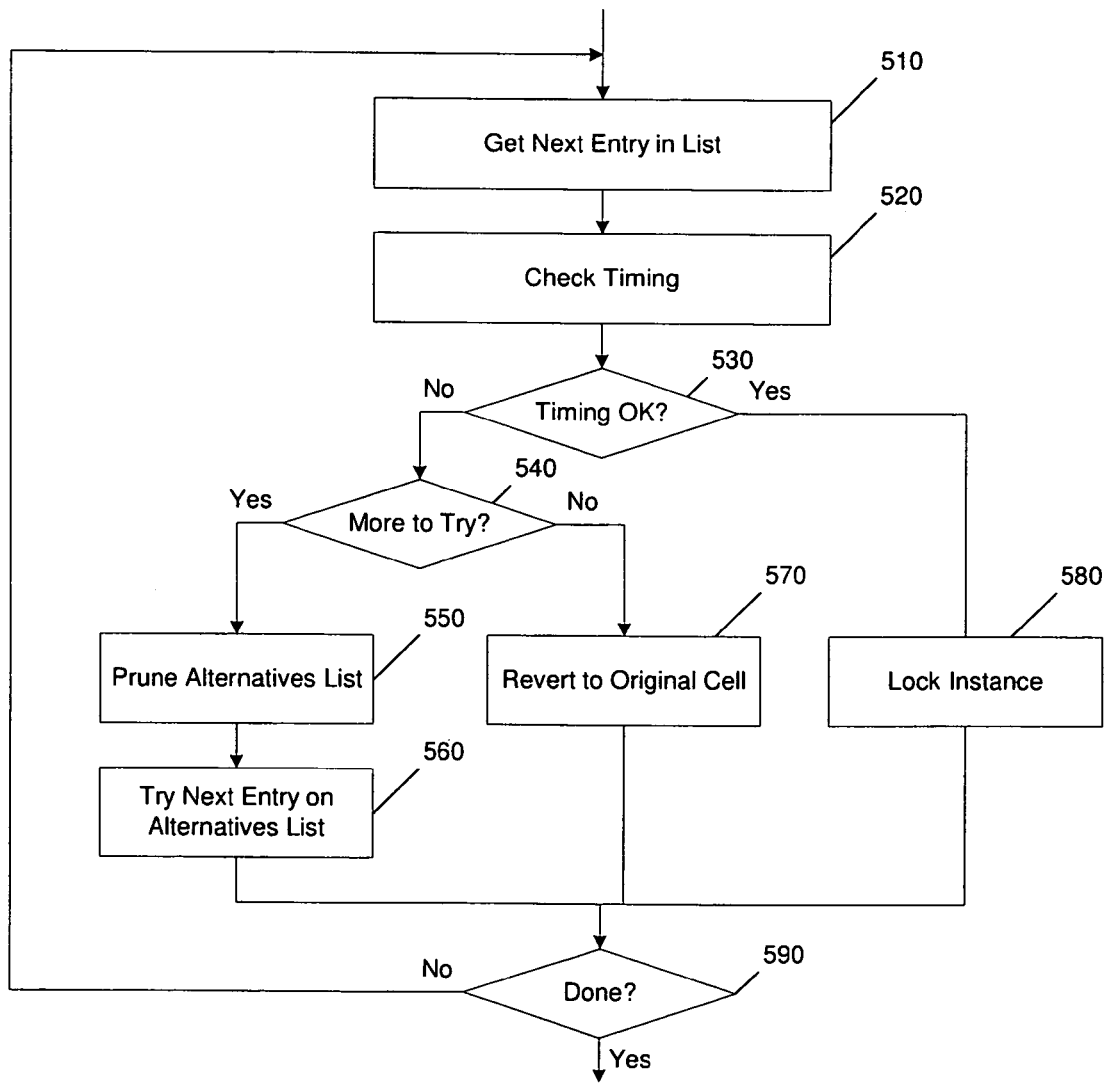
FIG. 5 illustrates a flow chart for an embodiment of the invention.

FIG. 5 illustrates more detail of step 345 in one embodiment. The steps illustrated in FIG. 5 represent a loop that processes each instance on the list of instances that were selected for replacement in step 335. In step 510, the next entry on the list is identified. In step 520, the timing that was analyzed is checked. The timing check in step 520 looks at the maximum transition time and the maximum capacitance properties in addition to the local slack through the instance. Also, the worst timing paths of the designs are checked. If either timing check fails, the change is rejected. In some embodiments, a critical range parameter is used to define a range of what is considered critical with respect to the timing requirement. If the timing analysis indicates that an instance is within this range of the timing requirement, even if it still meets the timing requirement, then the replacement would be rejected.

In step 530, if the timing is not acceptable, control passes to step 540. If there are more cells on the alternatives list for this instance, the instance is replaced with another entry on the alternatives list in step 560. Prior to choosing another alternative, the alternatives list is pruned in step 550. The purpose of pruning is to reduce the number of alternatives that need to be analyzed. Because the timing analysis step is computationally intensive, pruning increases efficiency by predicting which of the alternatives will fail timing and eliminating them from the alternatives list.

In some cases, the static timing analyzer has very slow runtime when looking at timing for paths that are not critical, but can analyze critical paths fairly quickly. Since step 540 is only performed after a replacement has been made that fails timing, the path is now critical so it is possible to quickly get the timing through the instance from the static timing analyzer. Once that has been computed, the expected timing through that instance can be calculated for each of the alternatives. Those that are expected to also fail can be skipped. For example, a nand2_16× may have the following alternatives: (1×, 2×, 4×, 8×, 12×). The nand2_16× is initially replaced with the lowest cost alternative, which is the nand2_1× instance. Suppose the nand2_1× instance fails timing. Then it may be possible to quickly estimate that the nand2_2× and nand2_4× will also fail timing, so they are eliminated in step 550. The next entry is the nand2_8× which is substituted during step 560. By doing this pruning, the attempts to replace the instance with a nand2_2× and nand2_4× are skipped and the method more quickly arrives at the final solution which is to replace the nand2_16× instance with a nand2_8× cell.

If there are no more alternatives on the alternatives list, control passes to step 570 in which the instance is reverted to its original cell. In the case that the timing is acceptable control passes from step 530 to step 580 and the replacement is locked. In step 590 a termination condition is evaluated. The loop in FIG. 5 terminates when all instances that have been selected for replacement have been examined. Note that the maximum number of reverts is limited to the largest number of different alternative library cells for each instance selected for replacement. Thus, in the case of $V_T$-swapping, and there are only low and high $V_T$ cells, then there is at most one iteration. In the case of general downsizing, then there may be on the order of five alternatives, and possibly up to 20 in the case of inverters or buffers. In these cases, the pruning step may eliminate most of the alternatives, so the number of iterations remains relatively low.

Figure 6:
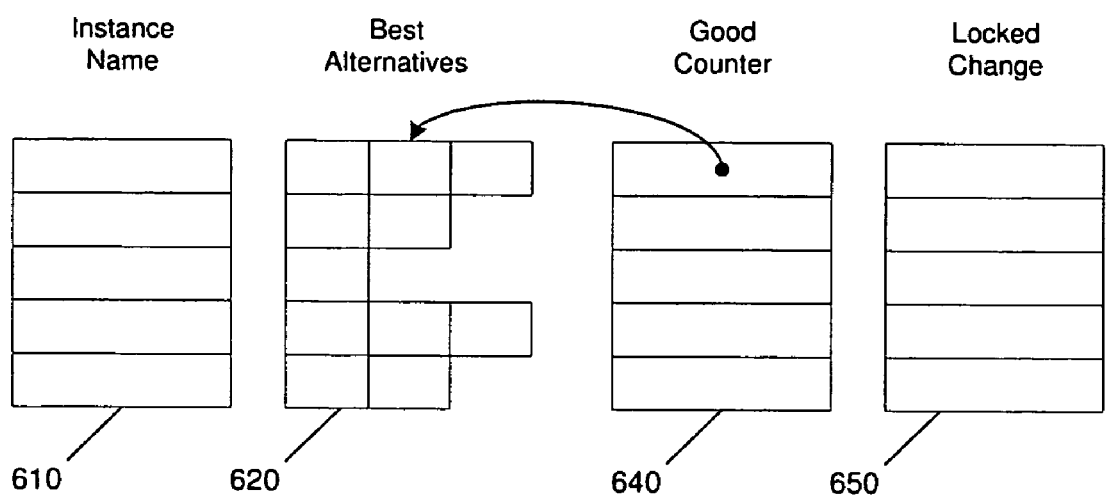
FIG. 6 illustrates a data structure used in an embodiment of the invention.

FIG. 6 illustrates an exemplary data structure used in an embodiment. A data structure such as is illustrated in FIG. 6 can be utilized to represent the instances collected in step 310 and to update the status of each instance as the design is optimized. For illustration purposes, FIG. 6 illustrates five instances. Structure 610 stores the instance name for an instance being optimized. Structure 620 stores a list of alternative cells for each instance being optimized. Structure 640 stores a pointer into the list of alternatives for each instance. The pointer represents the current alternative replacement for each instance, and may indicate with a special value (e.g. −1) that the instance has its original cell, and may indicate with a different special value (e.g. −2) that all alternatives have been tried. Structure 650 stores a flag indicating that a given instance has been locked (i.e. a good alternative replacement has been found for that instance).

The present invention has been described above in connection with several preferred embodiments. This has been done for purposes of illustration only, and variations of the inventions will be readily apparent to those skilled in the art and also fall within the scope of the invention.

The invention claimed is:

1. A method for optimizing a placed circuit design meeting a timing objective comprising the steps of: providing a placed circuit design on a computer system;

collecting a plurality of candidate instance cells in said design as candidates for replacement;

identifying one or more alternative cells in a cell library for each of said plurality of candidate instance cells;
selecting a set of selected instance cells from said plurality of candidate instance cells, wherein cells in said set of selected instance cells are independent from each other;
replacing each of said selected instance cells with one of said one or more alternative cells;
analyzing the timing of said placed circuit design as modified by said step of replacing;
locking an instance cell if timing objective is met;
choosing an alternative cell if timing objective is not met;
reverting to an original cell if no more alternatives exist;
repeating said steps of selecting, replacing and analyzing until a termination condition is met.

2. The method of claim 1 further comprising the step, before said step of selecting, of:
ordering said plurality of candidate instance cells according to likelihood of improvement of a design objective.

3. The method of claim 1 further comprising the step, before said step of selecting, of:
ordering said one or more alternative cells according to a cost parameter.

4. The method of claim 1 wherein said termination condition is based on the number of instances selected in said step of selecting.

5. The method of claim 2 wherein said design objective is based on an analysis of one or more parameters chosen from the set consisting of: slack, transition time, leakage power, dynamic power, area and yield.

6. The method of claim 3 wherein said cost parameter is based on an analysis of one or more parameters chosen from the set consisting of: leakage power, dynamic power, area and yield.

7. The method of claim 1 wherein said step of selecting is based on an identification of instances in the fan-in and fan-out cone of one or more instance cells.

8. A digital computer system programmed to optimize a placed circuit design meeting a timing objective by performing the steps of:
collecting a plurality of candidate instance cells in said design as candidates for replacement;
identifying one or more alternative cells in a cell library for each of said plurality of candidate instance cells;
selecting a set of selected instance cells from said plurality of candidate instance cells, wherein cells in said set of selected instance cells are independent from each other;
replacing each of said selected instance cells with one of said one or more alternative cells;
analyzing the timing of said placed circuit design as modified by said step of replacing;
locking an instance cell if timing object is met;
choosing an alternative cell if timing objective is not met;
reverting to an original cell if no more alternatives exist;
repeating said steps of selecting, replacing and analyzing until a termination condition is met.

9. The digital computer system of claim 8 further programmed to perform the step, before said step of selecting, of:
ordering said plurality of candidate instance cells according to likelihood of improvement of a design objective.

10. The digital computer system of claim 8 further programmed to perform the step, before said step of selecting, of:
ordering said one or more alternative cells according to a cost parameter.

11. The digital computer system of claim 8 wherein said termination condition is based on the number of instances selected in said step of selecting.

12. The digital computer system of claim 9 wherein said design objective is based on an analysis of one or more parameters chosen from the set consisting of: slack, transition time, leakage power, dynamic power, area and yield.

13. The digital computer system of claim 10 wherein said cost parameter is based on an analysis of one or more parameters chosen from the set consisting of: leakage power, dynamic power, area and yield.

14. The digital computer system of claim 8 wherein said step of selecting is based on an identification of instances in the fan-in and fan-out cone of one or more instance cells.

15. A computer-readable medium storing a computer program for optimizing a placed circuit design meeting a timing objective, said program implementing the steps of:
collecting a plurality of candidate instance cells in said design as candidates for replacement;
identifying one or more alternative cells in a cell library for each of said plurality of candidate instance cells;
selecting a set of selected instance cells from said plurality of candidate instance cells, wherein cells in said set of selected instance cells are independent from each other;
replacing each of said selected instance cells with one of said one or more alternative cells;
analyzing the timing of said placed circuit design as modified by said step of replacing;
locking an instance cell if timing objective is met;
choosing an alternative cell if timing objective is not met;
reverting to an original cell if no more alternatives exist;
repeating said steps of selecting, replacing and analyzing until a termination condition is met.

16. The computer-readable medium of claim 15 wherein said program further implements the step, before said step of selecting, of:
ordering said plurality of candidate instance cells according to likelihood of improvement of a design objective.

17. The computer-readable medium of claim 15 wherein said program further implements the step, before said step of selecting, of:
ordering said one or more alternative cells according to a cost parameter.

18. The computer-readable medium of claim 15 wherein said termination condition is based on the number of instances selected in said step of selecting.

19. The computer-readable medium of claim 16 wherein said design objective is based on an analysis of one or more parameters chosen from the set consisting of: slack, transition time, leakage power, dynamic power, area and yield.

20. The computer-readable medium of claim 17 wherein said cost parameter is based on an analysis of one or more parameters chosen from the set consisting of: leakage power, dynamic power, area and yield.

21. The computer-readable medium of claim 15 wherein said step of selecting is based on an identification of instances in the fan-in and fan-out cone of one or more instance cells.

* * * * *